US008110860B2

(12) United States Patent  
Inoue et al.

(10) Patent No.: US 8,110,860 B2  
(45) Date of Patent: Feb. 7, 2012

(54) IMAGING DEVICE

(75) Inventors: Tadao Inoue, Kawasaki (JP); Katsuyoshi Yamamoto, Kawasaki (JP); Hiroshi Kobayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 55 days.

(21) Appl. No.: 13/104,673

(22) Filed: May 10, 2011

(65) Prior Publication Data

US 2011/0210383 A1 Sep. 1, 2011

Related U.S. Application Data

(62) Division of application No. 11/861,691, filed on Sep. 26, 2007, now Pat. No. 7,964,902.

(30) Foreign Application Priority Data

Mar. 28, 2005 (JP) .................... PCT/JP2005/005745

(51) Int. Cl.  
H01L 31/062 (2006.01)

(52) U.S. Cl. ............................... 257/292; 257/E27.133

(58) Field of Classification Search .................. 257/292, 257/E27.133  
See application file for complete search history.

(56) References Cited

U.S. PATENT DOCUMENTS

| 6,051,447 | A | 4/2000 | Lee et al. |
| 6,278,102 | B1 | 8/2001 | Hook et al. |
| 6,320,617 | B1 | 11/2001 | Gee et al. |
| 6,521,925 | B1 | 2/2003 | Mori et al. |
| 6,590,242 | B1 | 7/2003 | Kozuka et al. |
| 6,649,951 | B2 | 11/2003 | Kozuka et al. |
| 7,078,745 | B2 | 7/2006 | Patrick |
| 7,193,258 | B2 * | 3/2007 | Hara et al. ................. 257/291 |
| 7,250,647 | B2 | 7/2007 | Rhodes |
| 7,701,029 | B2 | 4/2010 | Mabuchi |
| 2003/0183829 | A1 | 10/2003 | Yamaguchi et al. |
| 2003/0211405 | A1 * | 11/2003 | Venkataraman ............... 430/7 |
| 2004/0108502 | A1 | 6/2004 | Nakamura et al. |

(Continued)

FOREIGN PATENT DOCUMENTS

JP 10-209422 8/1998

(Continued)

OTHER PUBLICATIONS

Extended European Search Report, dated Oct. 4, 2010 for corresponding European Application No. 10169183.0.

(Continued)

*Primary Examiner* — Trung Q Dang  
(74) *Attorney, Agent, or Firm* — Fujitsu Patent Center

(57) ABSTRACT

First diffusion region constituting a photodiode in each pixel stores carriers generated according to incident light. Second diffusion region is formed at a surface of the first diffusion region to cover a peripheral part of the first diffusion region. In the peripheral part of the first diffusion region, crystal defects tend to occur by a process of forming an isolation region and a gate electrode, so that dark current noise tends to occur. The second diffusion region functioning as a protection layer prevents crystal defects in a manufacturing process. The second diffusion region isn't formed on a center of the surface of the first diffusion region where crystal defects don't tend to occur. In the first diffusion region where the second diffusion region isn't formed, the thickness of a depletion layer increases, which improves light detection sensitivity. This improves detection sensitivity of the photodiode without increasing the dark current noise.

12 Claims, 13 Drawing Sheets

U.S. PATENT DOCUMENTS

| | | | |
|---|---|---|---|
| 2004/0251481 | A1 | 12/2004 | Rhodes |
| 2007/0158713 | A1 | 7/2007 | Ohkawa |
| 2007/0296004 | A1 | 12/2007 | Mouli |
| 2008/0164500 | A1 | 7/2008 | Shinohara et al. |
| 2009/0050944 | A1* | 2/2009 | Hong .......................... 257/292 |
| 2009/0179237 | A1 | 7/2009 | Han |
| 2010/0237393 | A1* | 9/2010 | Inoue .......................... 257/291 |

FOREIGN PATENT DOCUMENTS

| | | |
|---|---|---|
| JP | 11-284166 | 10/1999 |
| JP | H11-274450 | 10/1999 |
| JP | 11-307753 | 11/1999 |
| JP | 2000-091552 | 3/2000 |
| JP | 2000-312024 | 11/2000 |
| JP | 2003-101004 | 4/2003 |
| JP | 2003-299111 | 10/2003 |

OTHER PUBLICATIONS

Extended European Search Report, dated Sep. 24, 2010 for corresponding European Application No. 10169184.8.

Extended European Search Report, dated Sep. 24, 2010 for corresponding European Application No. 10169185.5.

Translation of International Preliminary Report on Patentability mailed Oct. 11, 2007 of International Application No. PCT/JP2005/005745.

"Supplementary European Search Report", mailed by EPO and corresponding to European application No. 05 72 7817.7 on Sep. 20, 2010.

International Search Report of PCT/JP2005/005745, date of mailing May 17, 2005.

USPTO, (Dang) Notice of Allowance and Notice of Allowability, Mar. 21, 2011, in parent U.S. Appl. No. 11/861,691 [now allowed].

USPTO, (Dang) Non-Final Rejection, Oct. 19, 2010, in parent U.S. Appl. No. 11/861,691 [now allowed].

USPTO, (Dang) Non-Final Rejection, Feb. 5, 2010, in parent U.S. Appl. No. 11/861,691 [now allowed].

USPTO, (Dang) Restriction Requirement, Dec. 10, 2009, in parent U.S. Appl. No. 11/861,691 [now allowed].

European Office Action mailed Jun. 15, 2011 for corresponding European Application No. 10169185.5.

* cited by examiner

IMAGING DEVICE

CROSS REFERENCE TO RELATED APPLICATION

This application is a divisional of application Ser. No. 11/861,691, filed Sep. 26, 2007, which is a Continuation Application of International Application No. PCT/JP2005/005745, filed Mar. 28, 2005, and designating the U.S., the entire contents of which are incorporated herein by reference.

BACKGROUND

1. Field

The present invention relates to an imaging device including a photodiode. In particular, the present invention relates to a technique for improving detection sensitivity of the photodiode without increasing dark current noise.

2. Description of the Related Art

An imaging device such as an active pixel sensor (hereinafter also referred to as an APS) has a plurality of pixels each including a photodiode. Light incident on the pixel is converted into optical carriers by the photodiode and outputted as an electrical signal to generate an image signal. Generally, the imaging device is formed using pixels called a three-transistor type and a four-transistor type (Japanese Unexamined Patent Application Publication No. 2000-312024, Japanese Unexamined Patent Application Publication No. Hei 10-209422). In this kind of pixel, in order to prevent a dark current, at a surface of a diffusion layer to store optical carriers, a diffusion layer of an opposite conductive type with a higher impurity concentration than that of the above diffusion layer is formed. The dark current is a current flowing when no light is incident and a leak current due to semiconductor crystal defects. By forming the diffusion layer of the opposite conductive type on the diffusion layer to store the optical carriers, the occurrence of crystal defects in the diffusion layer to store the optical carriers can be prevented.

However, although the above diffusion layer of the opposite conductive type can prevent dark current noise, it makes a depletion layer of the diffusion layer to store the optical carriers relatively thinner. Therefore, light detection sensitivity in the pixel lowers due to the formation of the diffusion layer of the opposite conductive type. The dark current noise is large near an isolation region and in a contact region to draw out the electrical signal and so on and small in the other regions. Conventionally, any proposal to minimize the influence of the dark current noise and improve the light detection sensitivity has not been made.

SUMMARY

An object of the present invention is to improve detection sensitivity of a photodiode without increasing dark current noise.

In a first aspect of an imaging device of the present invention, a first diffusion region of each pixel is of a first conductive type, and constitutes a storing part of optical carriers in a photodiode. A transfer transistor uses the first diffusion region as a source electrode, and its gate electrode is formed in a position adjacent to the first diffusion region via an insulating film. The transfer transistor transfers the optical carriers stored in the photodiode to a drain electrode. A second diffusion region is of a second conductive type, and formed at a surface of the first diffusion region to cover a peripheral part of the first diffusion region. For example, an impurity concentration of the second diffusion region is higher than an impurity concentration of the first diffusion region. For example, the first conductive type is an n type, and the second conductive type is a p type.

Since the peripheral part of the first diffusion region is close to an interelement isolation structure part, many crystal defects tend to exist therein. Therefore, a leak current due to the crystal defects increases, and dark current noise tends to occur, so that in the peripheral part, a dark current larger than in a semiconductor surface of a central part of the first diffusion region occurs. Further, when the gate electrode of the transistor is formed in the position adjacent to the first diffusion region, crystal defects sometimes occur in the peripheral part of the first diffusion region adjacent to the gate electrode due to the influence of stress in a process of forming the gate electrode. In contrast, in a central portion (portion other than the peripheral part) of the surface of the first diffusion region, crystal defects do not tent to occur compared to the peripheral part. The second diffusion region on the peripheral part functions as a protection layer to prevent the occurrence of crystal defects in a manufacturing process.

On the other hand, in a so-called buried photodiode structure in which the second diffusion region of the opposite conductive type is formed on the first diffusion region, the thickness of a depletion layer near the surface becomes smaller, so that light detection sensitivity lowers. In the present invention, the second diffusion region is not formed on the central portion of the surface of the first diffusion region where the crystal defects do not tend to occur. In the first diffusion region where the second diffusion region is not formed, the thickness of the depletion layer can be increased, which can improve the light detection sensitivity. As just described, by selectively forming the second diffusion region on the first diffusion region, the detection sensitivity of the photodiode can be improved without the dark current noise being increased. For example, in the first diffusion region, the area of a region exposed at the surface is made larger than the area of a region covered with the second diffusion region, which can improve the detection sensitivity of the photodiode while keeping the dark current noise to a minimum.

As just described, a reduction in dark current noise and an improvement in light detection sensitivity can be balanced, so that even if the size of the pixel is reduced, the same level of SN ratio as in the past can be obtained. As a result, the imaging device can be made smaller, thereby enabling cost reduction. Alternatively, the number of pixels of the imaging device can be increased.

In a preferred example in the first aspect of the imaging device of the present invention, an isolation region is formed apart from the first diffusion region around a partial peripheral part other than a portion adjacent to the gate electrode of the peripheral part of the first diffusion region. The second diffusion region is formed from the partial peripheral part to the isolation region. There are many crystal defects near the isolation region where the periodicity of crystals of silicon or the like is destroyed. Therefore, the nearer the isolation region, the more frequently the leak current which causes the dark current noise tends to occur. By forming the second diffusion region to the vicinity of the isolation region, the occurrence of the dark current noise can be further suppressed.

In a second aspect of the imaging device of the present invention, a second diffusion region is formed at a surface of the first diffusion region to cover a partial peripheral part other than a portion adjacent to the gate electrode of a peripheral part of the first diffusion region. Namely, the second diffusion region is not formed in the portion adjacent to the gate electrode. The other characteristics are the same as in the above first aspect. When crystal defects do not tend to occur in the peripheral part of the first diffusion region adjacent to the gate electrode in the process of forming the gate electrode, the surface area of the first diffusion region covered with the second diffusion region can be reduced. Accordingly, the detection sensitivity of the photodiode can be further improved. Since the second diffusion region is not formed on the region adjacent to the gate electrode in the first diffusion region, the transfer efficiency of the optical carriers stored in the first diffusion region is not lowered. This can prevent optical carriers from being left in the first diffusion region, which can prevent the occurrence of an afterimage when a moving image is captured.

In a preferred example in the second aspects of the imaging device of the present invention, an isolation region is formed apart from the first diffusion region around the partial peripheral part other than the portion adjacent to the gate electrode of the peripheral part of the first diffusion region. The second diffusion region is formed from the partial peripheral part to the isolation region. There are many crystal defects near the isolation region where the periodicity of crystals of silicon or the like is destroyed. Therefore, the nearer the isolation region, the more frequently the leak current which causes the dark current noise tends to occur. By forming the second diffusion region to the vicinity of the isolation region, the occurrence of the dark current noise can be further suppressed.

In a preferred example in the second aspect of the imaging device of the present invention, a third diffusion region is formed at the peripheral part on the gate electrode side of the first diffusion region in an inner part of the first diffusion region. The third diffusion region is of the first conductive type and has an impurity concentration higher than an impurity concentration of the first diffusion region. Generally, when optical carriers are electrons, the optical carriers tend to gather in a diffusion region with a higher impurity concentration (the third diffusion region). Hence, by forming the third diffusion region near the gate electrode, the transfer efficiency of the optical carriers stored in the diffusion region can be improved. Further, generally, optical carriers are stored in a relatively deep region instead of the surface of the first diffusion region. Therefore, by forming the third diffusion region in the inner part of the first diffusion region, the optical carriers can be gathered more efficiently in the third diffusion region. At this time, the optical carriers do not gather near the surface of the first diffusion region with relatively many crystal defects, which can prevent the occurrence of the dark current.

In a preferred example in the second aspect of the imaging device of the present invention, a third diffusion region is formed in the peripheral part on the gate electrode side of the first diffusion region at the surface of the first diffusion region. The third diffusion region is of the first conductive type and has an impurity concentration higher than an impurity concentration of the first diffusion region. When crystal defects do not tend to occur at the surface of the first diffusion region adjacent to the gate electrode in the process of forming the gate electrode, the transfer efficiency of the optical carriers stored in the first diffusion region can be further improved if the third diffusion region is formed at the surface near a channel region of the transfer transistor in the first diffusion region.

In a preferred example in the second aspect of the imaging device of the present invention, a plurality of third diffusion regions is sequentially formed toward the gate electrode inside the second diffusion region in an inner part of and at the surface of the first diffusion region. The third diffusion regions are of the first conductive type and have impurity concentrations higher than an impurity concentration of the first diffusion region. The nearer the gate electrode, the higher the impurity concentration of the third diffusion region becomes. In this case, a built-in potential gradient can be formed toward the gate electrode side. In other words, electrons being optical carriers can be sequentially moved to the diffusion regions close to the gate electrode, which can improve the transfer efficiency of the optical carriers stored in the first diffusion region.

In a third aspect of the imaging device of the present invention, a pixel which receives relatively short-wavelength light incident via a first filter has the same structure as in the above first aspect. A pixel which receives relatively long-wavelength light incident via a second filter has a second diffusion region which is formed to cover an entire surface of the first diffusion region. By covering the entire surface of the first diffusion region with the second diffusion region, crystal defects at the surface of the first diffusion region can be reduced, which can reduce the dark current noise.

In a semiconductor of silicon or the like, a transmittance of the long-wavelength light is higher compared to a transmittance of the short-wavelength light. Therefore, in the pixel which receives the long-wavelength light, the light detection sensitivity does not tend to lower even if the entire surface of the first diffusion region is covered with the second diffusion region. On the other hand, the transmittance of the short-wavelength light is relatively low. Therefore, the pixel which receives the short-wavelength light is constituted by the first diffusion region having a region not covered with the second diffusion region to increase the light detection sensitivity. By changing the area of the second diffusion region according to the wavelength of incident light, the light detection sensitivity can be made uniform independently of wavelength while the occurrence of the dark current noise is minimized. For example, in the first diffusion region of each pixel receiving the relatively short-wavelength light, the area of a region exposed at the surface is made larger than the area of a region covered with the second diffusion region, which can improve the detection sensitivity of the photodiode while keeping the dark current noise to a minimum.

In a fourth aspect of the imaging device of the present invention, a pixel which receives relatively short-wavelength light incident via a first filter has the same structure as in the above second aspect. A pixel which receives relatively long-wavelength light incident via a second filter has a second diffusion region which is formed to cover an entire surface of the first diffusion region. Also in the fourth aspect, as in the above third aspect, the light detection sensitivity can be made uniform independently of wavelength while the occurrence of the dark current noise is minimized.

In a preferred example in the first to fourth aspects of the imaging device of the present invention, each pixel includes a reset transistor and a source follower transistor. A source electrode of the reset transistor is connected to the drain electrode of the transfer transistor and a drain electrode is connected to a voltage supply line. A gate electrode of the source follower transistor is connected to a floating diffusion node (the drain electrode of the transfer transistor and the source electrode of the reset transistor). The source follower transistor generates a pixel signal according to the amount of optical carriers and outputs the generated pixel signal from a source electrode. Since a contact region is not formed in the first diffusion region, any crystal defect in the first diffusion region does not occur due to the formation of the contact region. Accordingly, the occurrence of the dark current noise due to the formation of the contact region can be prevented.

DETAILED DESCRIPTION OF THE EMBODIMENTS

Figure 1:
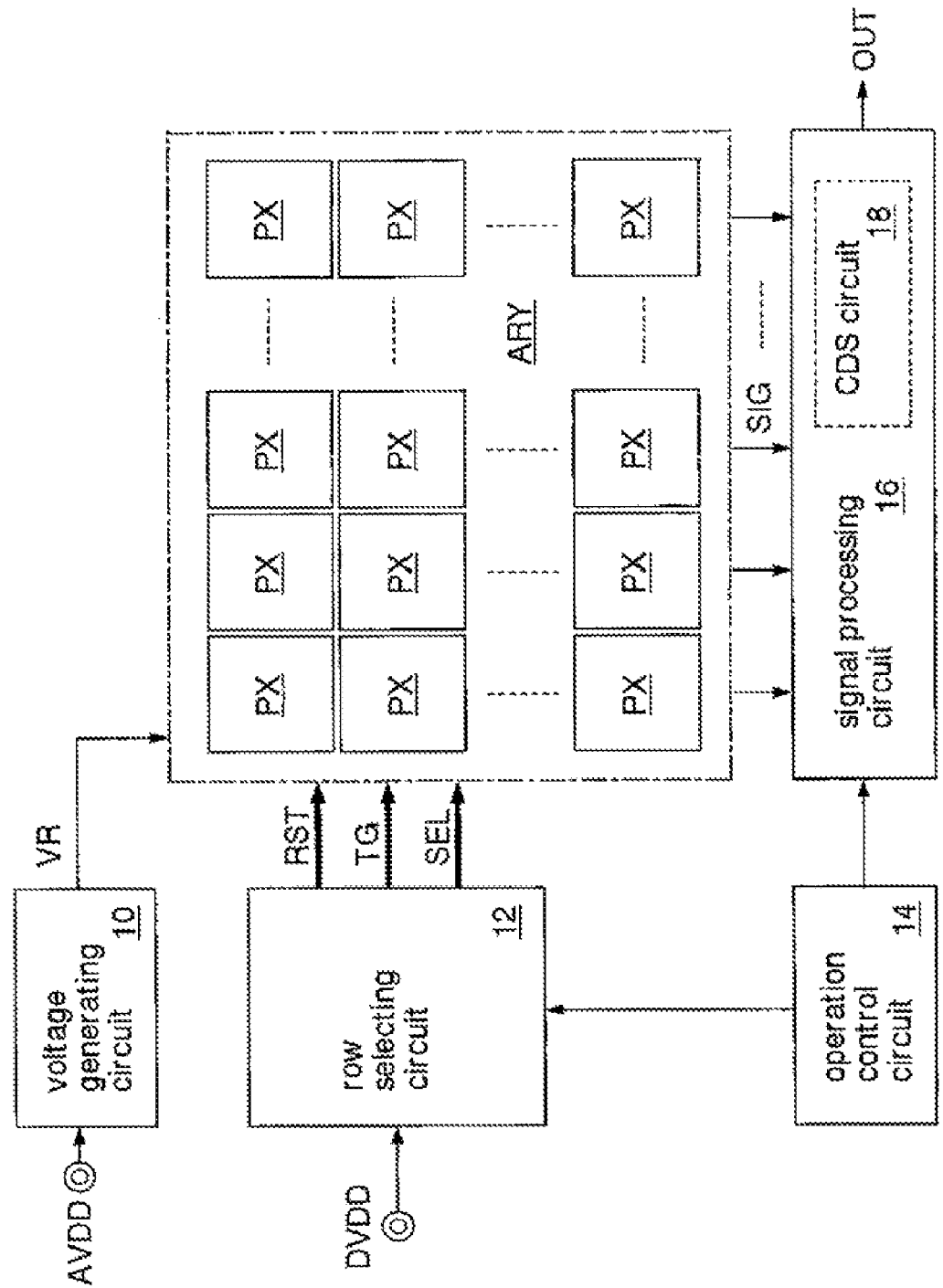
FIG. 1 is a block diagram showing a first embodiment of the present invention.

Hereinafter, embodiments of the present invention will be described, using the drawings. Each double circle in the drawings represents an external terminal. In the drawings, each signal line shown by the heavy line is constituted of a plurality of lines. Each signal line through which the signal is transmitted is denoted by the same reference symbol as the signal name.

FIG. 1 shows a first embodiment of an imaging device of the present invention. This imaging device is formed as an active pixel sensor chip on a silicon substrate, using a CMOS process. The imaging device includes a voltage generating circuit 10, a row selecting circuit 12, an operation control circuit 14, a signal processing circuit 16, and a pixel array ARY.

The voltage generating circuit 10 generates an internal voltage VR which is an always constant voltage in response to a power supply voltage AVDD. Incidentally, the voltage generating circuit 10 may modulate the internal voltage VR as necessary instead of generating the constant internal voltage VR. The power supply voltage AVDD is a power supply voltage for an analog circuit. The internal voltage VR is a voltage lower than the power supply voltage AVDD and always held at a constant voltage regardless of changes in the power supply voltage AVDD and changes in temperature. The row selecting circuit 12 outputs a reset signal RST, a transfer control signal TG, and a selection control signal SEL to the pixel array ARY. The operation control circuit 14 generates a plurality of timing signals to control an imaging operation of an active pixel sensor, and outputs them to the row selecting circuit 12, the signal processing circuit 16, and so on. The row selecting circuit 12 and the operation control circuit 14 operate in response to a power supply voltage DVDD for a digital circuit. Power supply voltage lines AVDD, DVDD are wired independently of each other to avoid noise interference.

The signal processing circuit 16 receives electrical signals SIG (image signals showing an image) simultaneously transferred from a plurality of pixels PX arranged in the lateral direction of this figure, and after performing parallel-serial conversion of the received signals SIG, sequentially outputs them as output signals OUT. The signal processing circuit 16 includes a correlated double sampling (CDS) circuit 18. The CDS circuit 18 subtracts noise data (noise voltage) from pixel data (read data, pixel voltage) including noise data to generate true data including no noise. The pixel array ARY includes a plurality of pixels PX arranged in a matrix.

Figure 2:
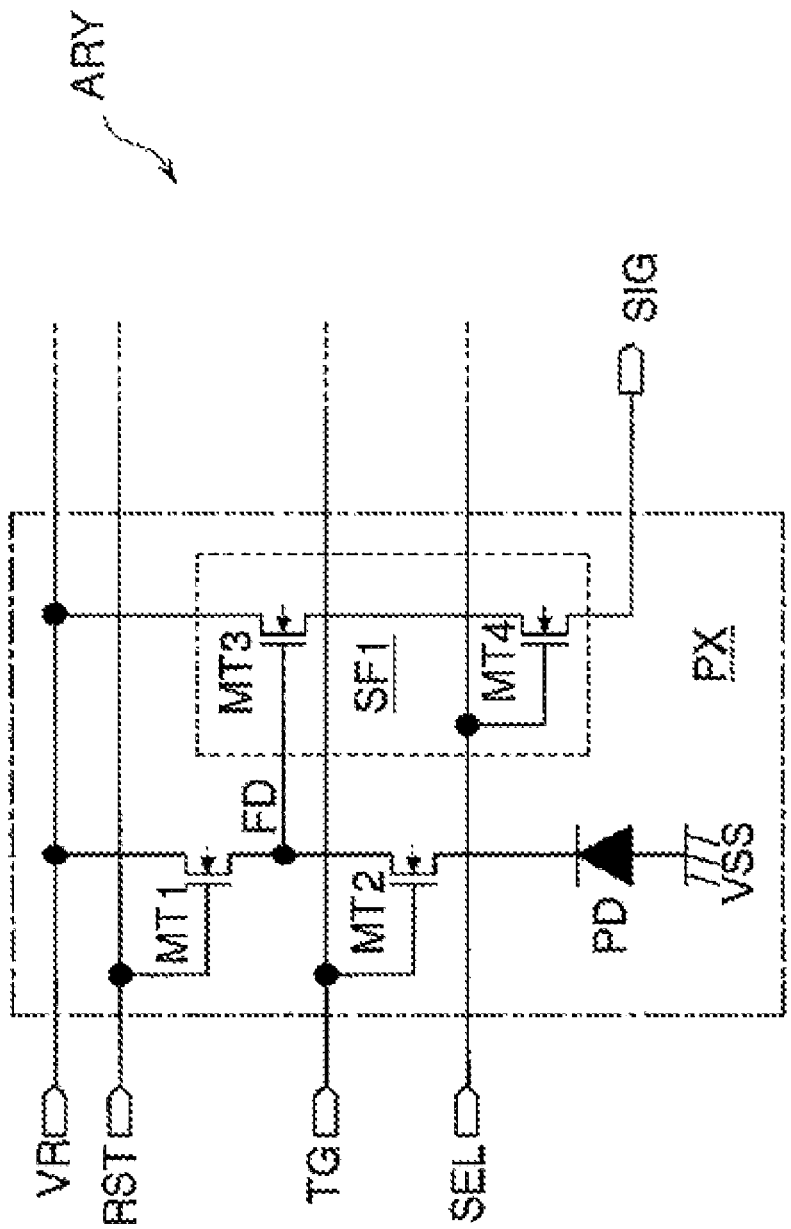
FIG. 2 is a circuit diagram showing details of a pixel shown in FIG. 1.

FIG. 2 shows details of the pixel PX shown in FIG. 1. The pixel PX of this embodiment is of a so-called four-transistor type. Each pixel PX includes nMOS transistors MT1, MT2 connected in series between an internal voltage line VR (voltage supply line) and a ground line VSS, a photodiode PD (photoelectric conversion element), and nMOS transistors MT3, MT4 connected in series between the internal voltage line VR and a pixel signal line SIG. A source of the transistor MT4 is connected to the pixel signal line SIG from which a read voltage and the noise voltage are outputted. A gate of the transistor MT1 (reset transistor) receives the reset signal RST. A gate of the transistor MT2 (transfer transistor) receives the transfer control signal TG. A gate of the transistor MT3 (source follower transistor) is connected to a connection node FD (floating diffusion node) of the transistors MT1, MT2. A gate of the transistor MT4 (selection transistor) receives the selection control signal SEL. The transistor MT3 operates as an amplifier and outputs the pixel signal SIG from a source electrode. The pixel signal SIG is outputted via the selection transistor MT4.

Figure 3:
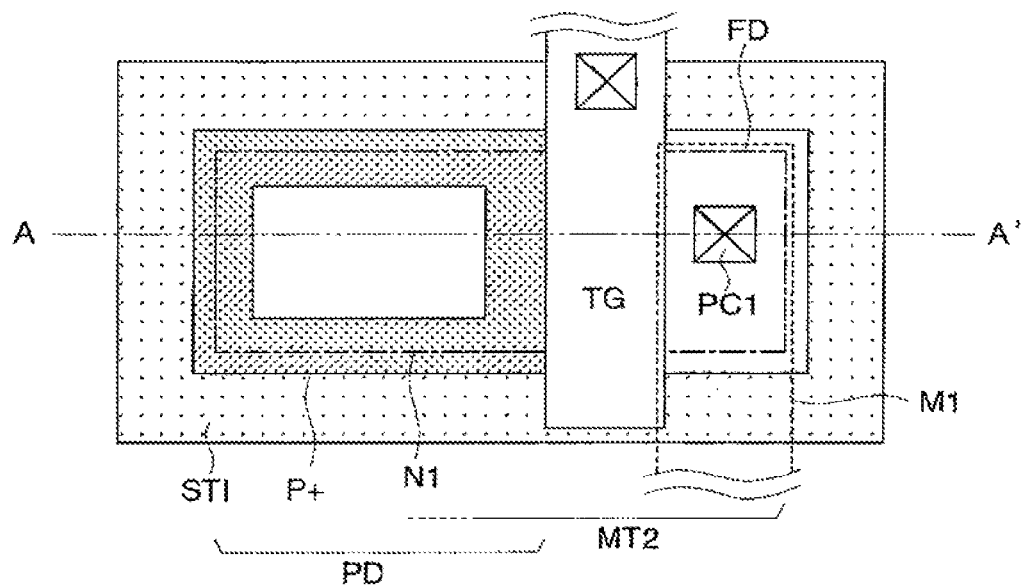
FIG. 3 is a plan view showing details of the pixel of the first embodiment.
Figure 4:
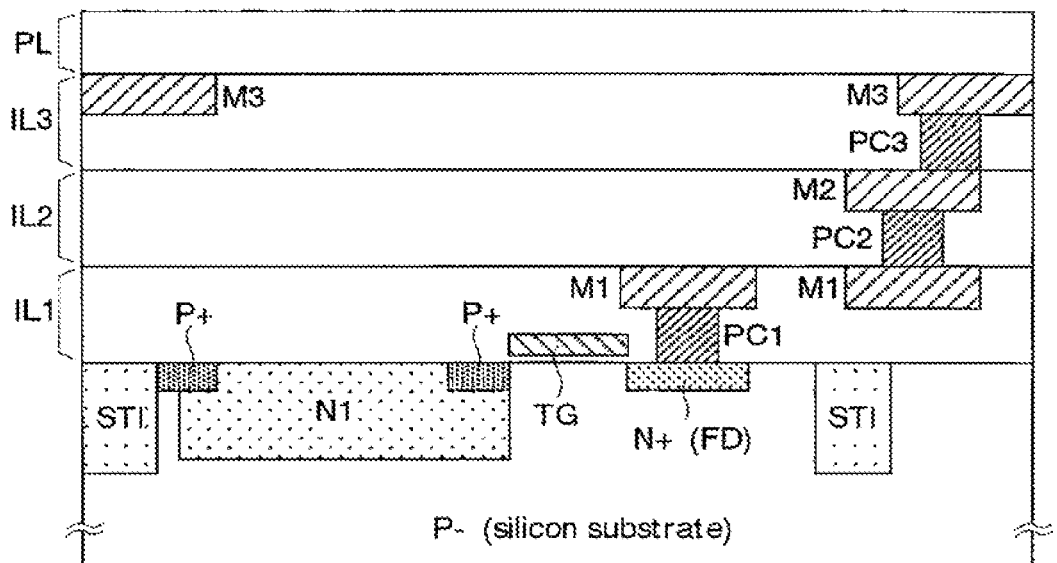
FIG. 4 is a sectional view along the line A-A' of FIG. 3.

FIG. 3 and FIG. 4 show details of the pixel of the first embodiment. In particular, FIG. 3 and FIG. 4 show details of the photodiode PD and the transfer transistor MT2. In FIG. 3, each square marked X represents a contact region (plug-contact PC). FIG. 4 shows a section along the line A-A' of FIG. 3.

The photodiode PD and the transfer transistor MT2 are formed inside an isolation region STI (Shallow Trench Isolation) formed in an annular shape (frame shape). Note that the present invention is also applicable to an APS in which an isolation region is LOCOS (Local Oxidation of Silicon). In this example, an anode of the photodiode PD is a p-type silicon substrate P−, and a cathode of the photodiode PD is an n-type (first conductive type) diffusion region N1 (first diffusion region, storing part of optical carriers) formed on the p-type silicon substrate P−. As shown in FIG. 3, the diffusion region N1 is rectangular shaped and formed apart from the isolation region STI. By forming the diffusion region N1 apart from the isolation region STI, crystal defects can be prevented from occurring in a peripheral part of the diffusion region N1 in a process of forming the isolation region STI.

The transfer transistor MT2 is constituted of a source electrode formed by the diffusion region N1, a gate electrode TG formed in a position adjacent to one side of the diffusion region N1 via an insulating film (gate insulating film), and a drain electrode formed by a diffusion region N+ (drain electrode, floating diffusion node FD) on the p-type silicon substrate P−. An impurity concentration of the diffusion region N1 is lower than an impurity concentration of the diffusion region N+. The gate insulating film is formed using an insulating layer IL1. At a surface of the diffusion region N1, a p-type (second conductive type) diffusion region P+ (second diffusion region) is formed in an annular shape (frame shape) to cover the peripheral part of the diffusion region N1. An impurity concentration of the diffusion region P+ is higher than the impurity concentration of the diffusion region N1. The diffusion region P+ can be formed by a normal semiconductor manufacturing process. Namely, the diffusion region P+ is formed by selectively boring a portion where the diffusion region P+ is formed using a photomask, implanting ions (impurity) such as boron from an opening, and diffusing the implanted ions by heat.

The diffusion region P+ is not formed in a central part of the surface of the diffusion region N1, and the central part is exposed to the insulating layer IL1 side. In this exposed region, the thickness of a depletion layer near the surface can be made larger compared to a portion covered with the diffusion region P+. Therefore, the storing capacity of optical carriers can be increased, which can improve light detection sensitivity. In particular, the light sensitivity to short-wavelength light such as blue which is easily absorbed at the surface of the diffusion region N1 can be improved. In this example, in the diffusion regions N1 of pixels PXB, PXG, the area of a rectangular region exposed at the surface is larger than the area of a frame-shaped region covered with the diffusion region P+. Consequently, light can be received more efficiently. Incidentally, if the detection sensitivity of the pixel PX becomes too high by the application of the present invention, the saturation voltage increases, and optical carriers are excessively stored in the diffusion region N1. In this case, it becomes impossible to fully perform a reset operation to allow the optical carriers to escape, and hence an afterimage occurs when a moving image is captured. To prevent this phenomenon, it is only necessary to lower the impurity concentration of the diffusion region N1.

A periphery of the diffusion region P+ formed corresponding to a C-shaped portion (partial peripheral part) other than a portion adjacent to the gate electrode TG of the peripheral part of the diffusion region N1 touches the isolation region STI beyond an end part of the diffusion region N1. By forming the diffusion region P+ to the isolation region STI, the surface of the peripheral part of the diffusion region N1 can be certainly protected. Consequently, the occurrence of crystal defects in the peripheral part of the diffusion region N1 in the process of forming the isolation region STI can be certainly prevented. Further, by forming the diffusion region P+ in a region adjacent to the gate electrode TG, the occurrence of crystal defects in the peripheral part on the gate electrode TG side of the diffusion region N1 in a process of forming the gate electrode TG can be prevented.

The drain electrode (diffusion region N+) of the transfer transistor MT2 is connected to a metal wiring M1 via a plug-contact PC1 made in the insulating layer IL1. Although not particularly shown, this metal wiring M1 is connected to a source electrode of the reset transistor MT1 and a gate electrode of the source follower transistor MT3. On the insulating layer IL1, insulating layers IL2, IL3 to isolate metal wiring layers M2, M3 from other layers respectively, and a protection insulating layer PL are stacked. The metal wiring layers M1, M2 are connected to each other by a plug contact PC2. The metal wiring layers M2, M3 are connected to each other by a plug contact PC3.

Incidentally, the APS is constituted of four-transistor type pixels PX. No contact region is formed in the diffusion region N1. Therefore, the occurrence of crystal defects in the diffusion region N1 in a process of forming the contact region can be prevented.

Figure 5:
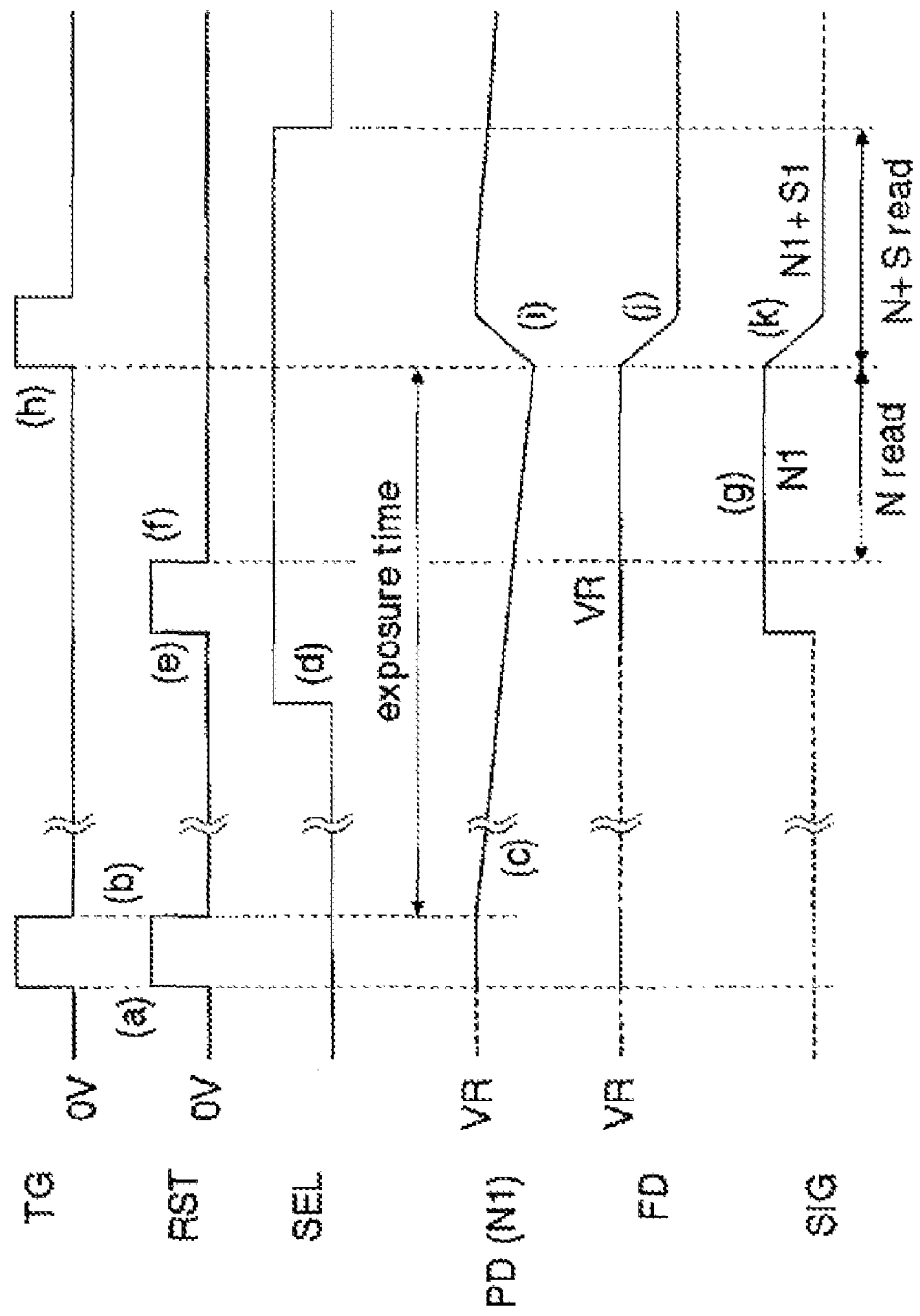
FIG. 5 is a timing chart showing a read operation of a pixel signal.

FIG. 5 shows a read operation of a pixel signal in each pixel of the APS described above. The read operation is performed by sequentially selecting a pixel row constituted of pixels PX arranged in the lateral direction in FIG. 1. FIG. 5 shows the read operation of one pixel PX of the pixel row. The read operation is performed at the same timing also in the other pixels PX of the pixel row. To perform the read operation, the row selecting circuit 12 shown in FIG. 1 repeatedly activates the reset signal RST, the transfer control signal TG, and the selection control signal SEL to a high level at predetermined timings. Each waveform shown by the dotted line in the figure represents a period when the states of voltage and the like are not fixed.

First, to reset the photodiode PD and the floating diffusion node FD, the reset signal RST and the transfer control signal TG are changed to the high level (for example, DVDD) (FIG. 5($a$)). By the reset operation, the diffusion region N1 of the photodiode PD and the floating diffusion node FD are set to the internal voltage VR. Then, the reset signal RST and the transfer control signal TG are changed to a low level (0 V) (FIG. 5($b$)). By the change of the transfer control signal TG to the low level, exposure of the photodiode PD is started. In the diffusion region N1 of the photodiode PD, electrons (optical carriers) are stored by the exposure, and its voltage gradually decreases (FIG. 5($c$)).

Subsequently, the selection control signal SEL is changed to the high level, and a source of the source follower transistor MT3 and an output node of the pixel signal SIG are connected via the selection transistor MT4 (FIG. 5($d$)). After a lapse of a predetermined time, the reset signal RST is changed to the high level (FIG. 5($e$)), and the floating diffusion node FD is reset again to the internal voltage VR. Since the selection transistor MT4 is on, the voltage of the pixel signal SIG changes to a voltage corresponding to the internal voltage VR. The reset signal RST is changed to the low level (FIG. 5($f$)), and noise data N1 is read (N read). The noise data (noise voltage) N1 is outputted as the pixel signal SIG by the source follower transistor MT3 operating with the change in the voltage of the floating diffusion node FD (FIG. 5($g$)).

Then, the transfer control signal TG is changed to the high level (FIG. 5($h$)), and the diffusion region N1 of the photodiode PD is connected to the floating diffusion node FD. The electrons stored in the diffusion region N1 are transferred to the floating diffusion node FD. Due to this transfer, the voltage of the diffusion region N1 increases (FIG. 5($i$)), and the voltage of the floating diffusion node FD decreases (FIG. 5($j$)). The voltage of the pixel signal SIG decreases with the change in the voltage of the floating diffusion node FD (FIG. 5($k$)). Namely, pixel data (pixel voltage N1+S1) including the noise data (noise voltage) N1 is outputted from each pixel PX (N+S read). After this, the CDS circuit 18 shown in FIG. 1 subtracts the noise voltage N1 from the pixel voltage (N1+S1) including noise to generate true pixel data from which noise is eliminated.

As described above, in the first embodiment, thanks to the diffusion region P+, the occurrence of the crystal defects in the peripheral part of the diffusion region N1 in the processes of forming the isolation region STI and the gate TG can be prevented. Namely, the dark current noise can be reduced. Simultaneously, by forming the diffusion region P+ in the frame shape, the light detection sensitivity in the central part of the diffusion region N1 where the crystal defects do not tend to occur can be increased. Accordingly, even if the size of the pixel PX is reduced, the same level of SN ratio as in the past can be obtained. As a result, the chip size of the APS can be reduced, leading to a reduction in the cost of the APS. Alternatively, the number of pixels of the APS can be increased.

Figure 6:
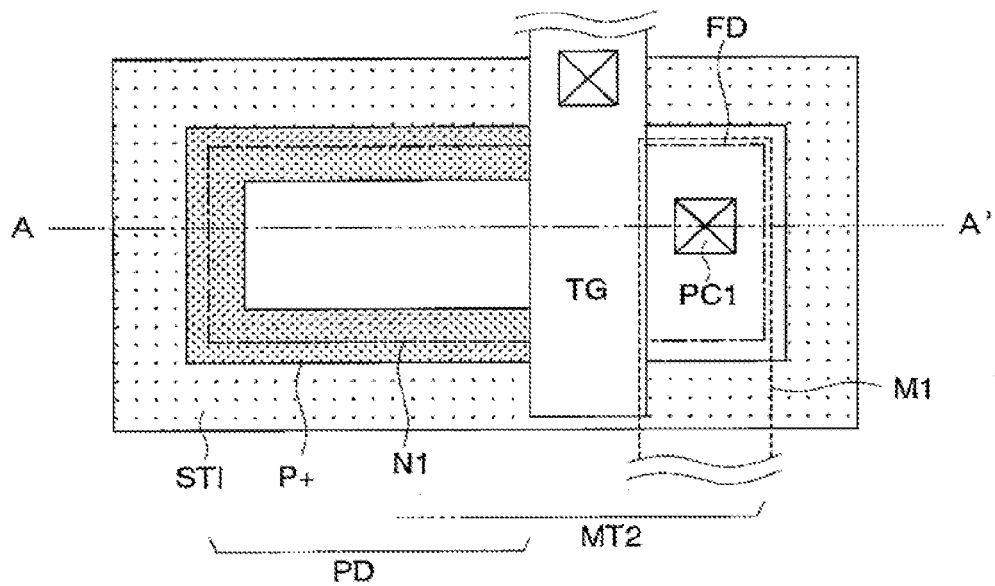
FIG. 6 is a plan view showing details of a pixel of a second embodiment.
Figure 7:
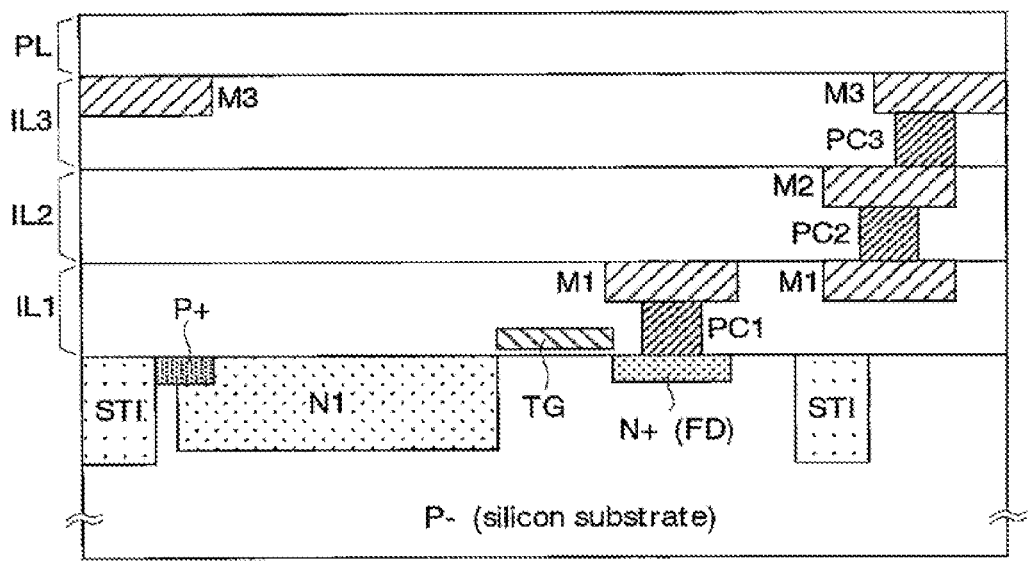
FIG. 7 is a sectional view along the line A-A' of FIG. 6.

FIG. 6 and FIG. 7 show details of a pixel in a second embodiment of the imaging device of the present invention. The same reference symbols are used to designate the same elements as those described in the first embodiment, and a detailed description thereof is omitted. In this embodiment, the shape of the p-type diffusion region P+ (second diffusion region) is different from that in the first embodiment. The other constitutions are the same as in the first embodiment. Namely, this imaging device is formed as the active pixel sensor chip on the silicon substrate, using the CMOS process.

The diffusion region P+ is formed in a U-shape at the surface of the diffusion region N1 to cover the partial peripheral part other than the portion adjacent to the gate electrode TG of the peripheral part of the diffusion region N1. In this example, in the diffusion regions N1 of the pixels PXB, PXG, the area of a rectangular region exposed at the surface is larger than the area of a frame-shaped region covered with the diffusion region P+. Therefore, light can be received more efficiently. The diffusion region P+ is not formed in a region adjacent to a channel region of the transfer transistor MT2 (under the gate electrode TG). Hence, the transfer efficiency of optical carriers (electrons) by the transfer transistor MT2 increases compared to the first embodiment. Accordingly, optical carriers can be prevented from being left in the diffusion region N1.

When crystal defects do not tend to occur at the surface of the diffusion region N1 adjacent to the gate electrode TG in the process of forming the gate electrode TG, it is unnecessary to form the diffusion region P+ on this region. Therefore, the surface area of the first diffusion region covered with the diffusion region P+ can be reduced, which can further improve the detection sensitivity of the photodiode.

As described above, also in the second embodiment, the same effect as in the above first embodiment can be obtained. Further, in this embodiment, the diffusion region P+ is not formed on the region adjacent to the gate electrode TG in the diffusion region N1, which can prevent the transfer efficiency of the optical carriers stored in the diffusion region N1 from lowering. As a result, the optical carriers can be prevented from being left in the diffusion region N1, which can prevent the occurrence of the afterimage when the moving image is captured.

Figure 8:
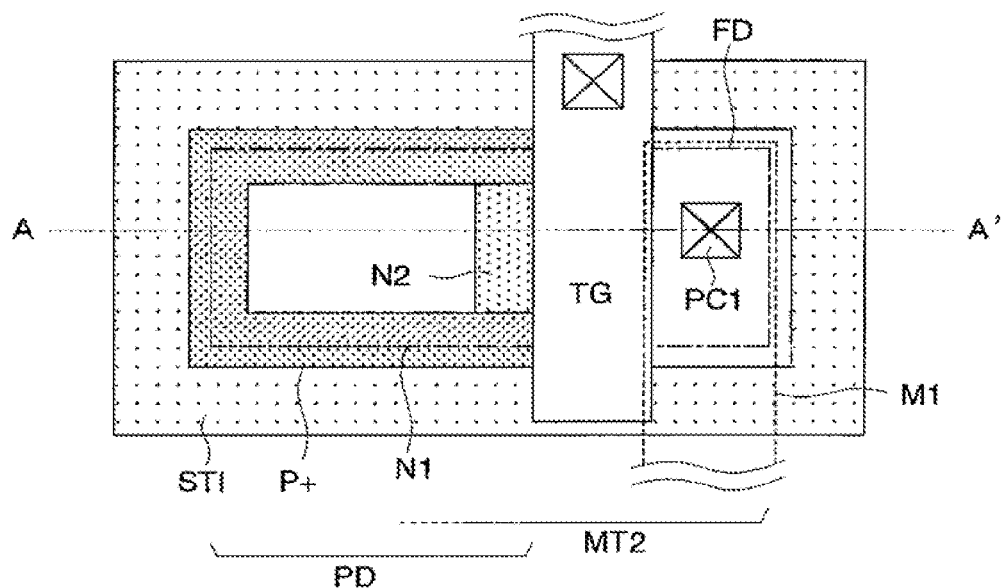
FIG. 8 is a plan view showing details of a pixel of a third embodiment.
Figure 9:
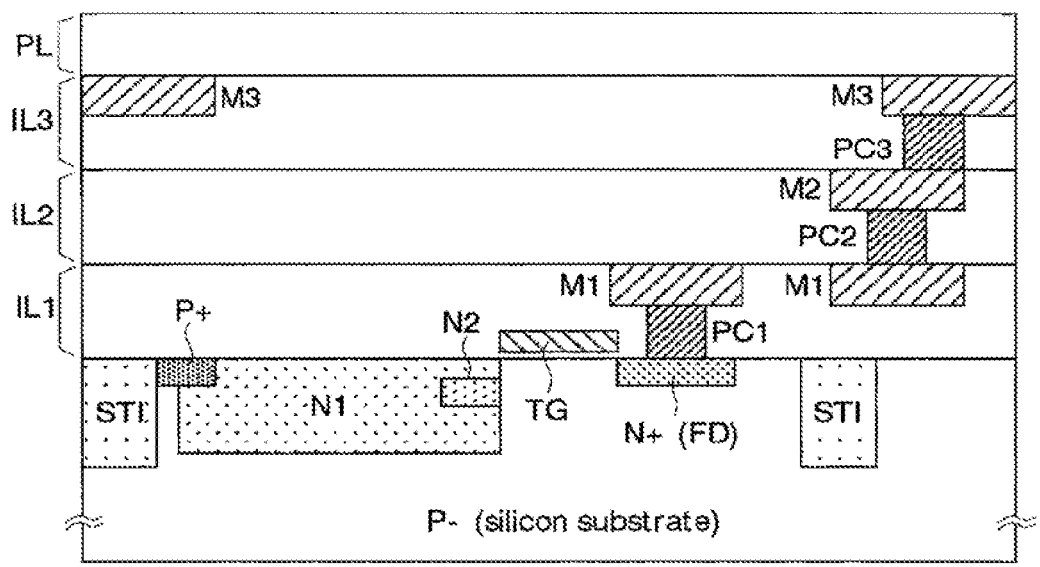
FIG. 9 is a sectional view along the line A-A' of FIG. 8.

FIG. 8 and FIG. 9 show details of a pixel in a third embodiment of the imaging device of the present invention. The same reference symbols are used to designate the same elements as those described in the first and second embodiments, and a detailed description thereof is omitted. In this embodiment, an n-type diffusion region N2 (third diffusion region) is formed in the peripheral part on the gate electrode TG side of the transfer transistor in an inner part of the diffusion region N1. The other constitutions are the same as in the second embodiment. Namely, this imaging device is formed as the active pixel sensor chip on the silicon substrate, using the CMOS process.

An impurity concentration of the diffusion region N2 is higher than the impurity concentration of the diffusion region N1. Generally, electrons being optical carriers tend to gather in a diffusion region with a higher impurity concentration. Hence, by forming the diffusion region N2 near the gate electrode TG, the transfer efficiency of the optical carriers stored in the diffusion region N1 can be improved. Further, the optical carriers are stored in a relatively deep region instead of the surface of the diffusion region N1. Therefore, by forming the diffusion region N2 in the inner part of the diffusion region N1, the optical carriers can be more efficiently gathered in the diffusion region N2. At this time, the optical carriers do not gather near the surface of the diffusion region N1 with relatively many crystal defects, which can prevent the occurrence of the dark current.

As described above, also in the third embodiment, the same effects as in the above first and second embodiments can be obtained. Further, in this embodiment, the optical carriers stored in the diffusion region N1 can be transferred to the drain electrode FD of the transfer transistor MT2 at a higher efficiency. As a result, the occurrence of the afterimage when the moving image is captured can be certainly prevented.

Figure 10:
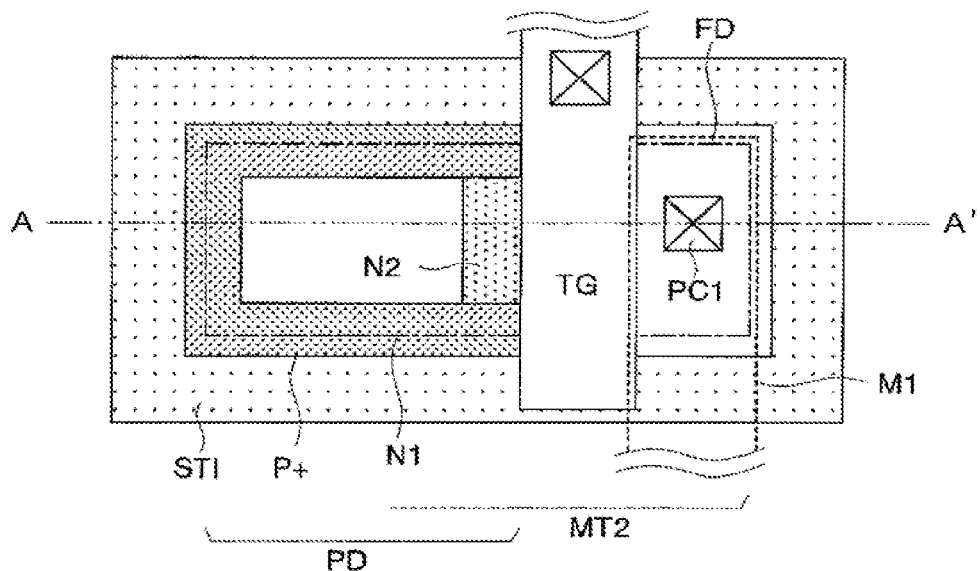
FIG. 10 is a plan view showing details of a pixel of a fourth embodiment.
Figure 11:
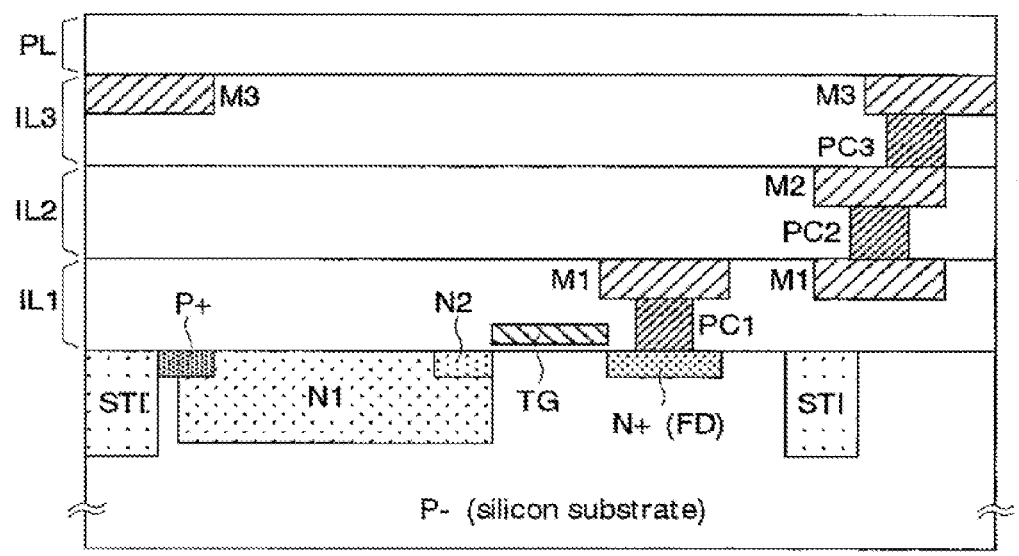
FIG. 11 is a sectional view along the line A-A' of FIG. 10.

FIG. 10 and FIG. 11 show details of a pixel in a fourth embodiment of the imaging device of the present invention. The same reference symbols are used to designate the same elements as those described in the first and second embodiments, and a detailed description thereof is omitted. In this embodiment, the n-type diffusion region N2 (third diffusion region) is formed in the peripheral part on the gate electrode TG side of the transfer transistor at the surface of the diffusion region N1. The other constitutions are the same as in the second embodiment. Namely, this imaging device is formed as the active pixel sensor chip on the silicon substrate, using the CMOS process.

The impurity concentration of the diffusion region N2 is higher than the impurity concentration of the diffusion region N1. When crystal defects do not tent to occur at the surface of the diffusion region N1 adjacent to the gate electrode TG in the process of forming the gate electrode TG, the transfer efficiency of the optical carriers stored in the diffusion region N1 can be further improved if the diffusion region N2 is formed at the surface close to the channel region of the transfer transistor MT2 in the diffusion region N1.

As described above, also in the fourth embodiment, the same effects as in the above first to third embodiments can be obtained. Further, in this embodiment, when the crystal defects do not tend to occur at the surface of the diffusion region N1 in the process of forming the gate electrode TG, the transfer efficiency of the optical carriers stored in the diffusion region N1 can be further improved than in the second embodiment.

Figure 12:
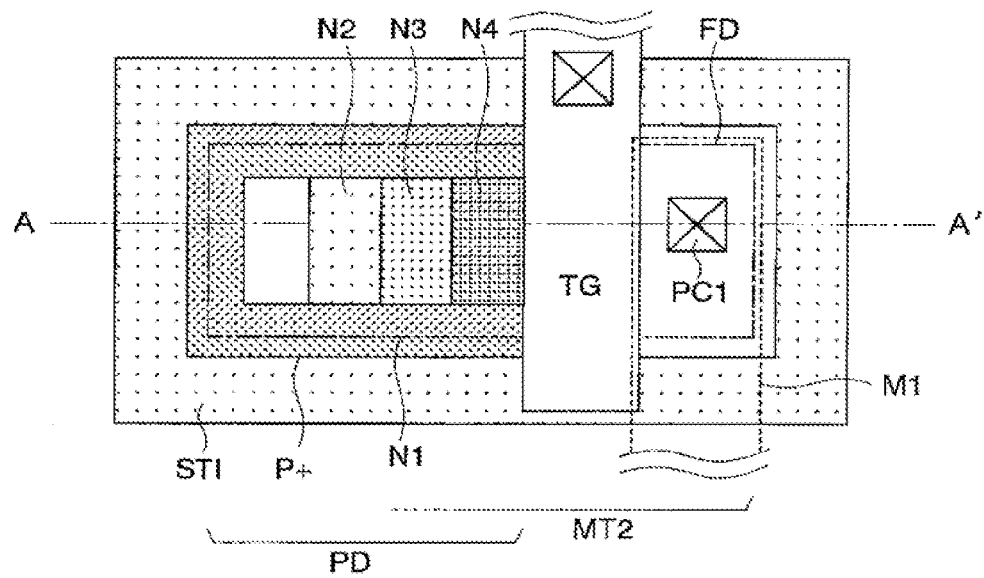
FIG. 12 is a plan view showing details of a pixel of a fifth embodiment.
Figure 13:
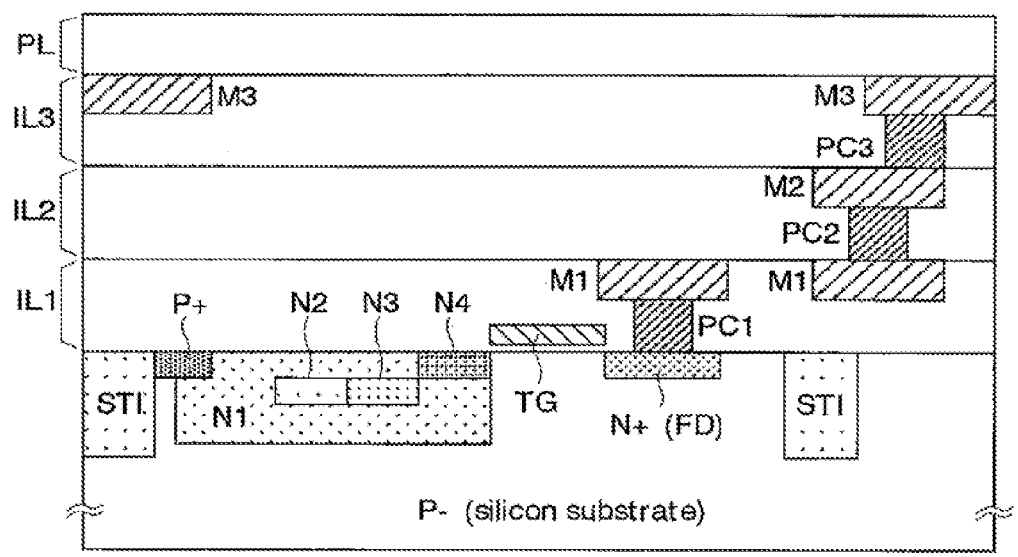
FIG. 13 is a sectional view along the line A-A' of FIG. 12.

FIG. 12 and FIG. 13 show details of a pixel in a fifth embodiment of the imaging device of the present invention. The same reference symbols are used to designate the same elements as those described in the first and second embodiments, and a detailed description thereof is omitted. In this embodiment, n-type diffusion regions N2, N3, N4 (third diffusion regions) arranged toward the gate electrode TG of the transfer transistor are formed in the inner part of and at the surface of the diffusion region N1. In this example, the diffusion regions N2, N3 are formed in the inner part of the diffusion region N1, and the diffusion region N4 is formed at the surface of the diffusion region N1. The other constitutions are the same as in the second embodiment. Namely, this imaging device is formed as the active pixel sensor chip on the silicon substrate, using the CMOS process.

Impurity concentrations of the diffusion regions N2, N3, N4 are higher than the impurity concentration of the diffusion region N1, and become gradually higher in this order. The nearer the gate electrode TG, the higher the impurity concentrations of the diffusion regions N2, N3, N4 are made, so that a built-in potential gradient can be formed toward the gate electrode TG. In other words, electrons being optical carriers can be sequentially moved to the diffusion regions N2, N3, N4 close to the gate electrode TG, which can improve the transfer efficiency of the optical carriers stored in the diffusion region N1. As described above, also in the fifth embodiment, the same effects as in the above first to fourth embodiments can be obtained.

Figure 14:
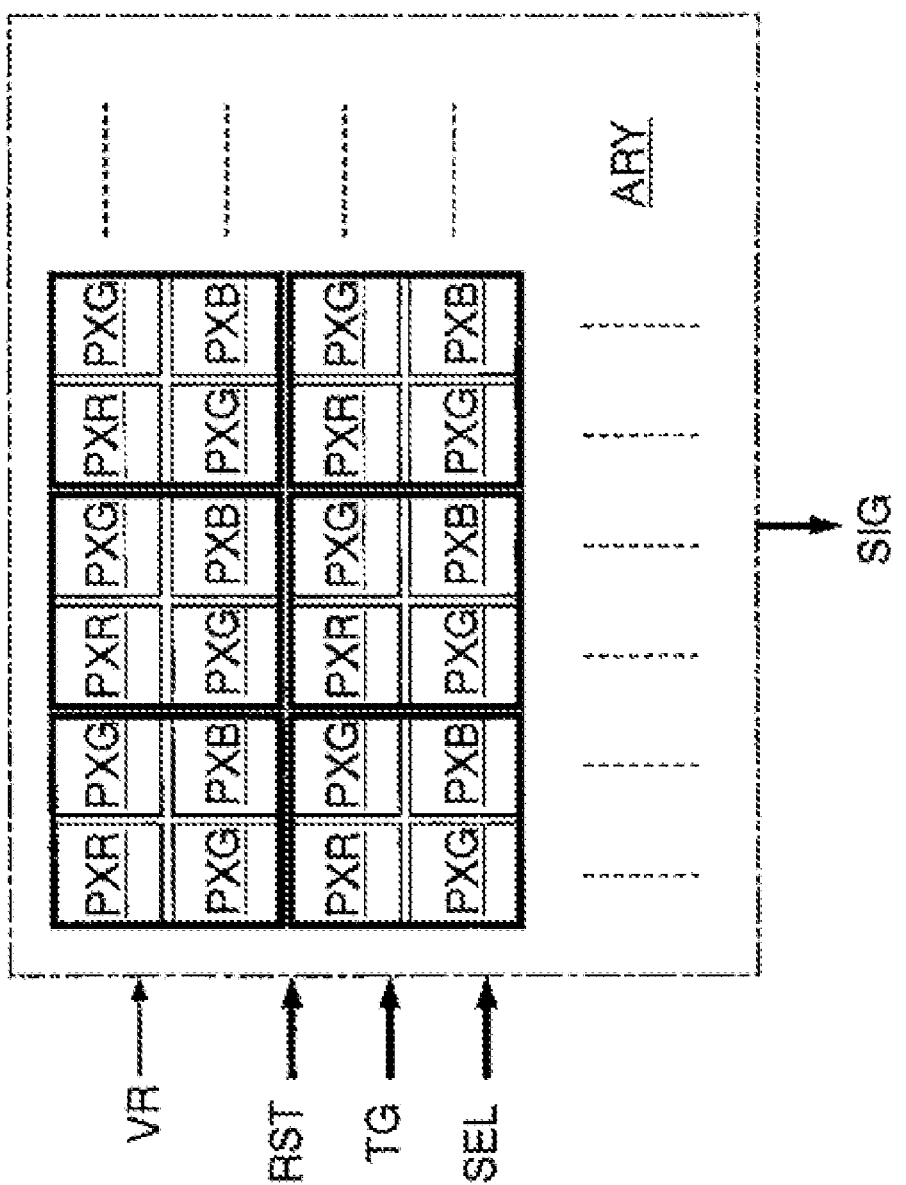
FIG. 14 is a layout diagram showing details of a pixel array of a sixth embodiment.

FIG. 14 shows details of a pixel array in a sixth embodiment of the imaging device of the present invention. The same reference symbols are used to designate the same elements as those described in the first embodiment, and a detailed description thereof is omitted. This imaging device is formed as an active pixel sensor to acquire a color image on the silicon substrate, using the CMOS process. In this embodiment, filters (not shown) to separate incident light to light having red, green, and blue wavelengths are placed above the pixel array ARY.

Four pixels constituted of two pixels lengthwise and two pixels crosswise in the pixel array ARY are assigned to one pixel PXR receiving red light, two pixels PXG receiving green light, and one pixel PXB receiving blue light. Above the pixel PXR, a filter which selectively transmits only the red light (long-wavelength light) is placed. Above the pixel PXG, a filter which selectively transmits only the green light (middle-wavelength light) is placed. Above the pixel PXB, a filter which selectively transmits only the blue light (short-wavelength light) is placed. Generally, this type of filter array is called a Bayer array. Constitutions other than the pixel array ARY are the same as in the first embodiment.

Figure 15:
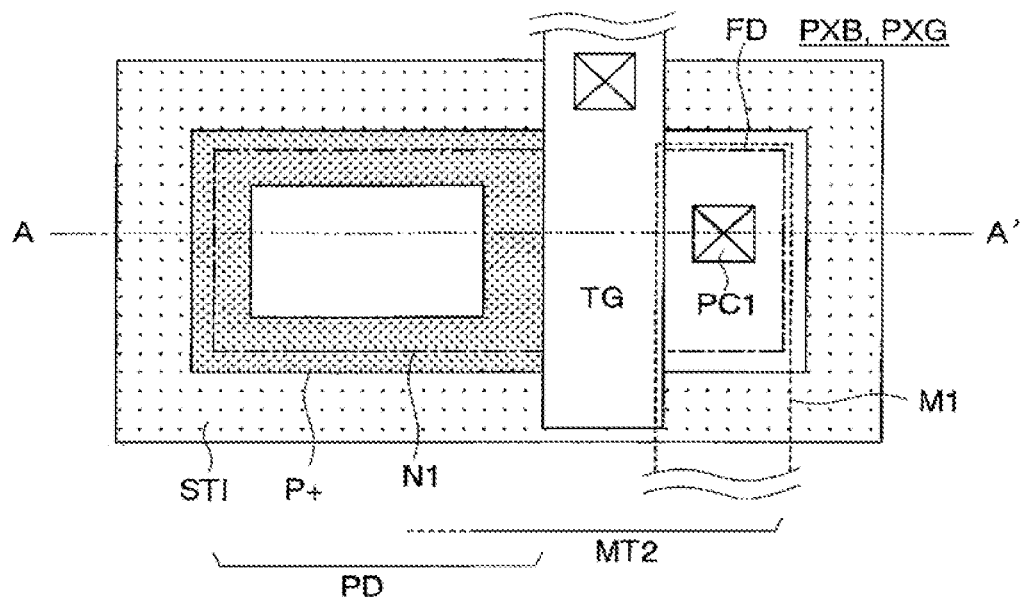
FIG. 15 is a plan view showing details of a pixel receiving blue and green light of the sixth embodiment.
Figure 16:
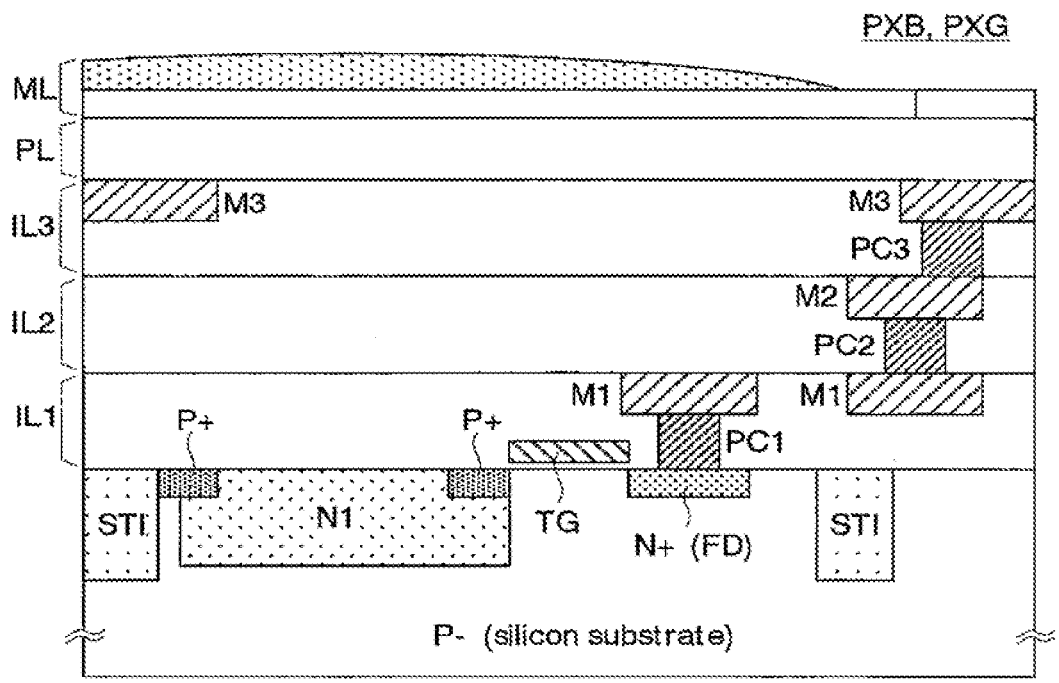
FIG. 16 is a sectional view along the line A-A' of FIG. 15.

FIG. 15 and FIG. 16 show details of the pixels PXB, PXG receiving the blue and the green light in the sixth embodiment. The pixels PXB, PXG are the same as the pixel PX (FIG. 3, FIG. 4) of the first embodiment except that a micro lens ML is formed above the diffusion region N1. Namely, the pixels PXB, PXG each have the diffusion region P+ covering the peripheral part of the surface of the diffusion region N1. The central part of the diffusion region N1 is exposed. The short-wavelength light such as blue or green has difficulty in transmitting into the silicon, compared to the long-wavelength light such as red. Therefore, by forming the region not covered with the second diffusion region P+ in the diffusion regions N1 which constitute the pixels PXB, PXG receiving the blue and the green light, the light detection sensitivity can be relatively increased. In this example, in the diffusion regions N1 of the pixels PXB, PXG, the area of a rectangular region exposed at the surface is larger than the area of a frame-shaped region covered with the diffusion region P+. Consequently, light can be received more efficiently.

Further, by gathering light incident on the pixels PXB, PXG in the diffusion region N1 by the micro lens ML, the light detection sensitivity can be improved. By forming the micro lens ML in a shape allowing light to gather the region whose surface is not covered with the diffusion region P+ on the diffusion region N1, the light detection sensitivity can be substantially improved.

Figure 17:
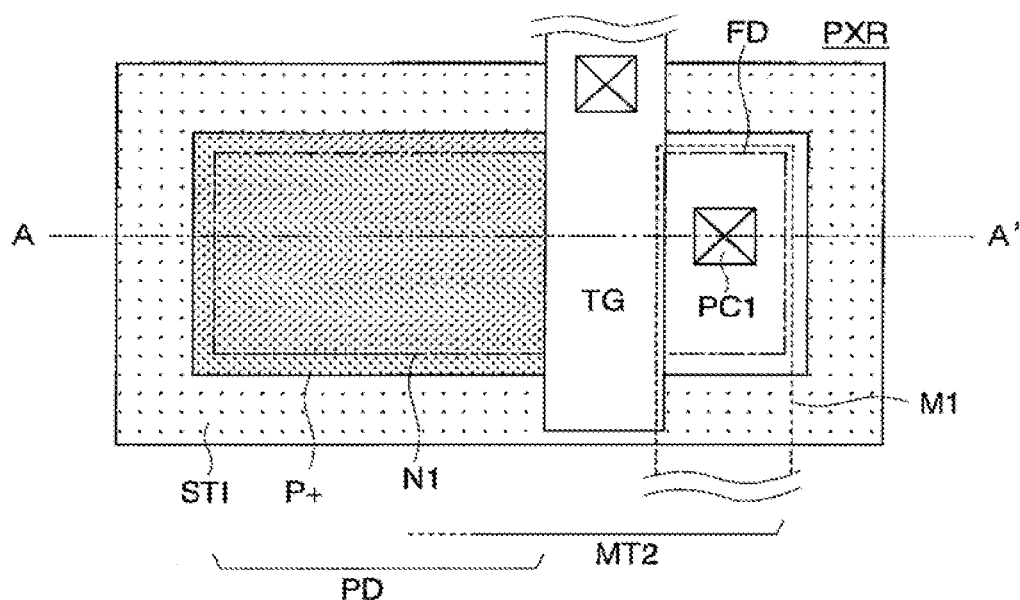
FIG. 17 is a plan view showing details of a pixel receiving red light of the sixth embodiment.
Figure 18:
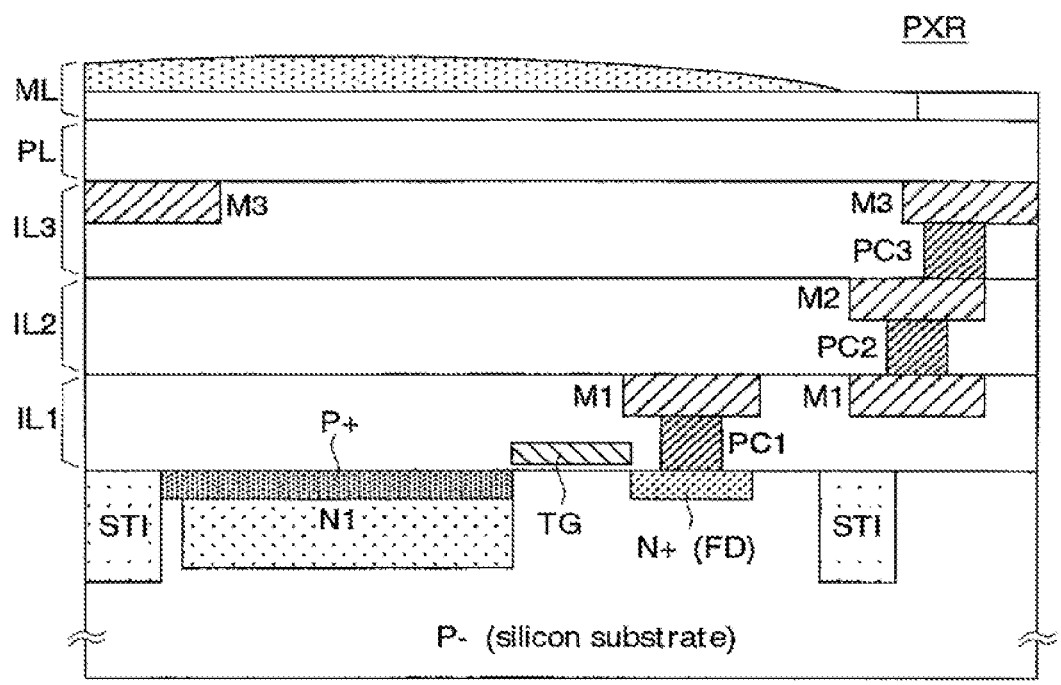
FIG. 18 is a sectional view along the line A-A' of FIG. 17.

FIG. 17 and FIG. 18 show details of the pixel PXR receiving the red light in the sixth embodiment. The pixel PXR is the same as the pixel PX of the first embodiment except that the micro lens ML is formed at an upper part and the p-type diffusion region P+ covers the whole area on the n-type diffusion region N1. The long-wavelength light such as red easily transmits into the silicon. Therefore, even if the p-type diffusion region P+ is formed on the whole area on the diffusion region N1, the influence of a reduction in light detection sensitivity is small. Further, by covering the entire surface of the diffusion region N1 with the diffusion region P+, crystal defects at the surface of the diffusion region N1 can be reduced, which can reduce the dark current noise.

As just described, the light detection sensitivity relatively improves in the pixels PXB, PXG, and relatively reduces in the pixel PXR. By changing the area of the diffusion region P+ according to the wavelength of incident light, the light detection sensitivity can be made uniform independently of wavelength while the occurrence of the dark current noise is minimized.

As described above, also in the sixth embodiment, the same effect as in the above first embodiment can be obtained. Further, in this embodiment, by changing the area of the diffusion region P+ formed on the diffusion region N1 according to the wavelengths of light incident on the pixels PXB, PXG, PXR, the light detection sensitivity can be made uniform independently of the pixels PXB, PXG, PXR.

Figure 19:
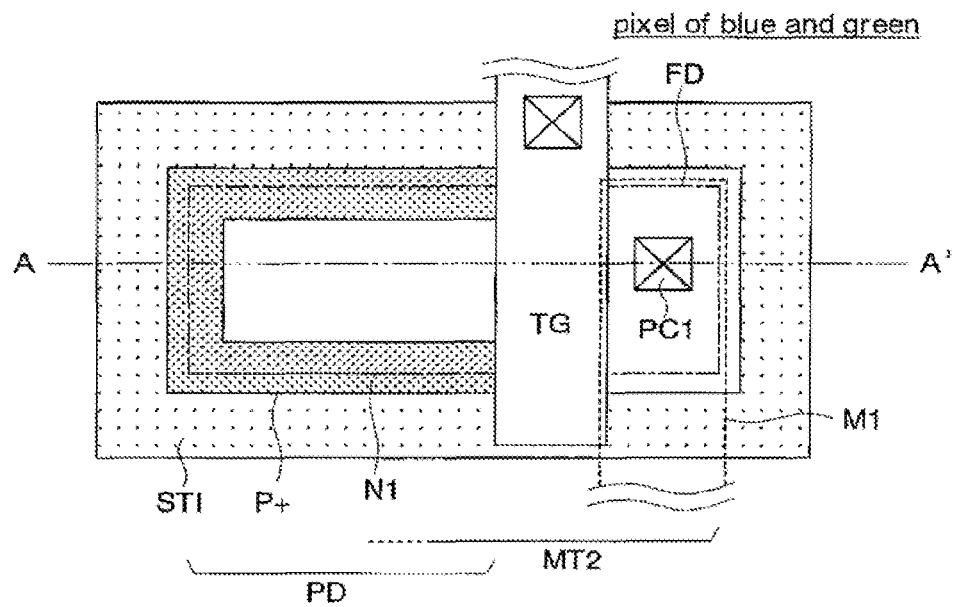
FIG. 19 is a plan view showing details of a pixel receiving blue and green light of a seventh embodiment.
Figure 20:
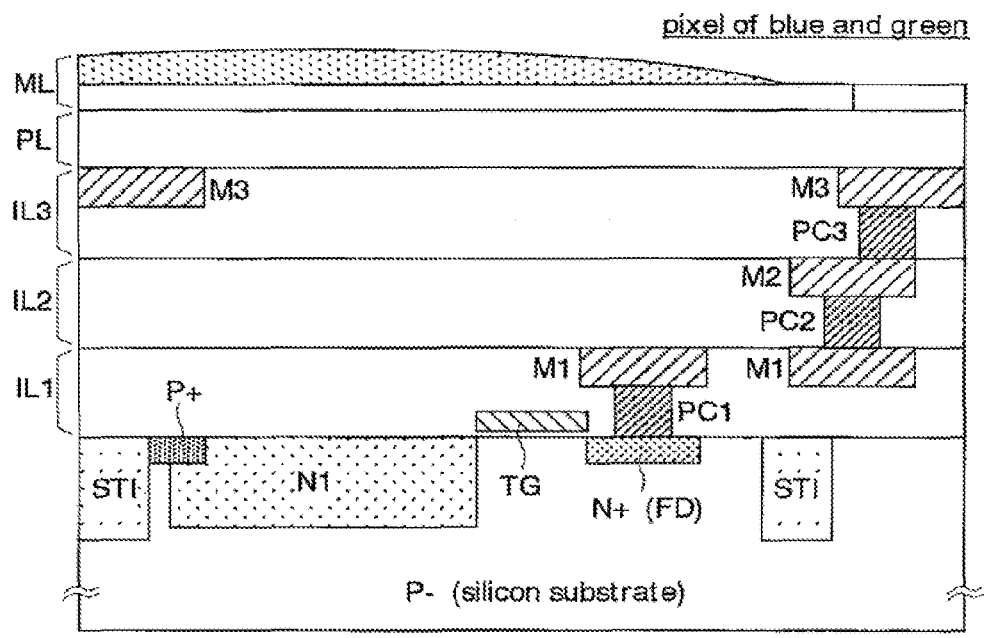
FIG. 20 is a sectional view along the line A-A' of FIG. 19.

FIG. 19 and FIG. 20 show details of the pixels PXB, PXG receiving the blue and the green light in a seventh embodiment of the imaging device of the present invention. The same reference symbols are used to designate the same elements as those described in the first, second, and sixth embodiments, and a detailed description thereof is omitted. The pixels PXB, PXG are the same as the pixel PX (FIG. 6, FIG. 7) of the second embodiment except that the micro lens ML is formed above the diffusion region N1. The pixel PXR (not shown) receiving the red light is the same as the pixel PXR (FIG. 17, FIG. 18) of the sixth embodiment. The other constitutions are the same as in the first and sixth embodiments. Namely, this imaging device is formed as the active pixel sensor chip to acquire the color image on the silicon substrate using the CMOS process. Also in this embodiment, the same effects as in the above first, second, and sixth embodiments can be obtained.

Figure 21:
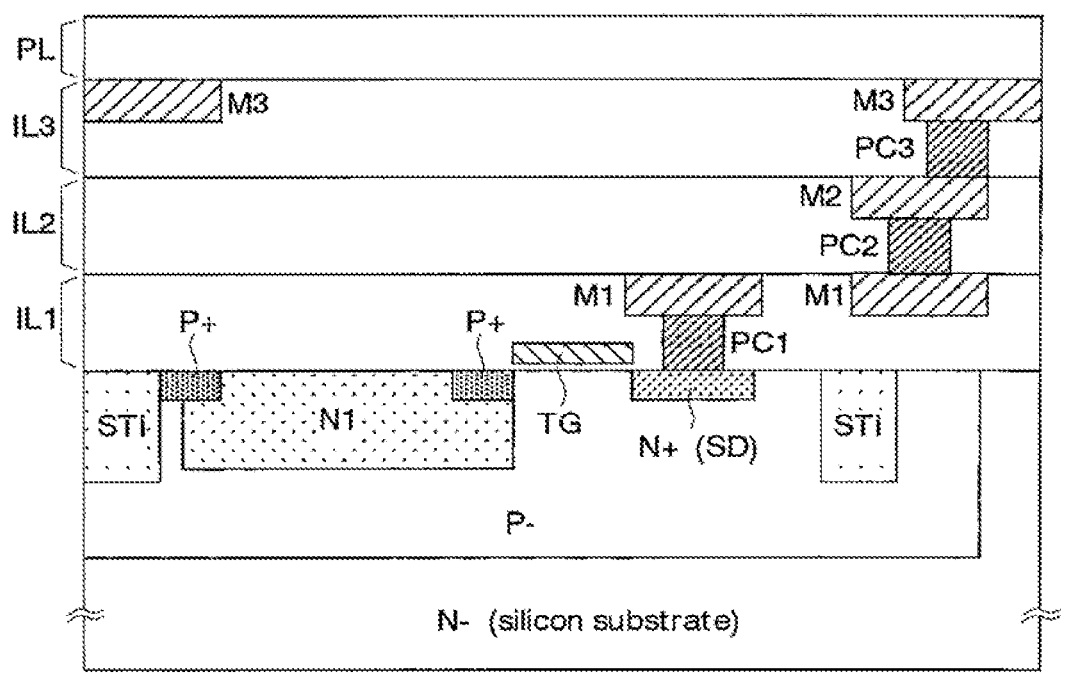
FIG. 21 is a sectional view showing another example of the pixel of the present invention.

Incidentally, in the above embodiments, the example in which the n-type diffusion region N1 is formed on the p-type silicon substrate P– is described. The present invention is not limited to these embodiments. For example, as shown in FIG. 21, it is also possible to form a p-type well region P– on an n-type silicon substrate N– and form the n-type diffusion region N1 on the well region P–. Alternatively, it is also possible to form the p-type well region P– on a p-type silicon substrate and form the n-type diffusion region N1 on the well region P–. In the well region P–, adjustment of the impurity concentration is easier, compared to the silicon substrate. This can offer greater flexibility to process design such as the thickness of the depletion layer. Accordingly, it becomes easy to design the characteristic of the photodiode.

In the above embodiments, the example in which the present invention is applied to the photodiode which stores optical carriers (electrons) in the n-type diffusion region N1 is described. The present invention is not limited to these embodiments. For example, even if the present invention is applied to a photodiode which stores optical carriers (holes) in a p-type diffusion region, the same effect can be obtained.

In the above sixth and seventh embodiments, the example in which the micro lens ML is formed above the diffusion region N1 is described. The present invention is not limited to these embodiments. For example, the micro lens ML may be formed above the diffusion regions N1 of the first to fifth embodiments.

In the above fifth embodiment, the example in which the diffusion regions N2, N3 are formed in the inner part of the diffusion region N1 and the diffusion region N4 is formed at the surface of the diffusion region N1 is described. The present invention is not limited to this embodiment. For example, all the diffusion regions N2, N3, N4 may be formed at the surface of the diffusion region N1.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. An imaging device, comprising a plurality of pixels each including a photodiode, wherein
said pixels receive either light incident via a first filter which selectively transmits relatively short-wavelength light or light incident via a second filter which selectively transmits relatively long-wavelength light,
each pixel receiving said relatively short-wavelength light includes:
a first diffusion region of a first conductive type which constitutes a storing part of optical carriers in said photodiode;
a transfer transistor which uses said first diffusion region as a source electrode, whose gate electrode is formed in a position adjacent to said first diffusion region via an insulating film, and which transfers the optical carriers stored in said photodiode to a drain electrode; and
a second diffusion region of a second conductive type which is formed at a surface of said first diffusion region to cover a peripheral part of said first diffusion region and has a polarity opposite to that of the first conductive type, and
each pixel receiving said relatively long-wavelength light comprises:
a first diffusion region of the first conductive type which constitutes a storing part of optical carriers in said photodiode;
a transfer transistor which uses said first diffusion region as a source electrode, whose gate electrode is formed in a position adjacent to said first diffusion region via an insulating film, and which transfers the optical carriers stored in said photodiode to a drain electrode; and
a second diffusion region of the second conductive type which is formed to cover an entire surface of said first diffusion region and has a polarity opposite to that of the first conductive type.

2. The imaging device according to claim 1, wherein in the first diffusion region of the each pixel receiving said relatively short-wavelength light, an area of a region exposed at the surface is larger than an area of a region covered with said second diffusion region.

3. The imaging device according to claim 1, wherein the each pixel comprises:
a reset transistor whose source electrode is connected to the drain electrode of the transfer transistor and drain electrode is connected to a voltage supply line;
a source follower transistor whose gate electrode is connected to a floating diffusion node being the drain electrode of the transfer transistor and the source electrode of the reset transistor and which outputs a pixel signal from a source electrode; and
a contact region which connects said floating diffusion node and the gate electrode of said source follower transistor to each other.

4. The imaging device according to claim 1, wherein an impurity concentration of said second diffusion region is higher than an impurity concentration of said first diffusion region.

5. The imaging device according to claim 1, wherein said first conductive type is an n type, and said second conductive type is a p type.

6. The imaging device according to claim 1, further comprising
a micro lens which is formed above said first diffusion region of said each pixel to gather light incident on said each pixel in said first diffusion region.

7. An imaging device, comprising a plurality of pixels each including a photodiode, wherein
said pixels receive either light incident via a first filter which selectively transmits relatively short-wavelength light or light incident via a second filter which selectively transmits relatively long-wavelength light,
each pixel receiving said relatively short-wavelength light includes:
a first diffusion region of a first conductive type which constitutes a storing part of optical carriers in said photodiode;
a transfer transistor which uses said first diffusion region as a source electrode, whose gate electrode is formed in a position adjacent to said first diffusion region via an insulating film, and which transfers the optical carriers stored in said photodiode to a drain electrode; and
a second diffusion region of a second conductive type which is formed at a surface of said first diffusion region to cover a partial peripheral part other than a portion adjacent to said gate electrode of a peripheral part of said first diffusion region and has a polarity opposite to that of the first conductive type, and
each pixel receiving said relatively long-wavelength light comprises:
a first diffusion region of the first conductive type which constitutes a storing part of optical carriers in said photodiode;
a transfer transistor which uses said first diffusion region as a source electrode, whose gate electrode is formed in a position adjacent to said first diffusion region via an insulating film, and which transfers the optical carriers stored in said photodiode to a drain electrode; and
a second diffusion region of the second conductive type which is formed to cover an entire surface of said first diffusion region and has a polarity opposite to that of the first conductive type.

8. The imaging device according to claim 7, wherein in the first diffusion region of the each pixel receiving said relatively short-wavelength light, an area of a region exposed at the surface is larger than an area of a region covered with said second diffusion region.

9. The imaging device according to claim 7, wherein the each pixel comprises:
a reset transistor whose source electrode is connected to the drain electrode of the transfer transistor and drain electrode is connected to a voltage supply line;
a source follower transistor whose gate electrode is connected to a floating diffusion node being the drain electrode of the transfer transistor and the source electrode of the reset transistor and which outputs a pixel signal from a source electrode; and
a contact region which connects said floating diffusion node and the gate electrode of said source follower transistor to each other.

10. The imaging device according to claim 7, wherein an impurity concentration of said second diffusion region is higher than an impurity concentration of said first diffusion region.

11. The imaging device according to claim 7, wherein said first conductive type is an n type, and said second conductive type is a p type.

12. The imaging device according to claim 7, further comprising
a micro lens which is formed above said first diffusion region of said each pixel to gather light incident on said each pixel in said first diffusion region.

* * * * *